United States Patent
Komatsu (10) Patent No.: US 8,203,104 B2
(45) Date of Patent: Jun. 19, 2012

(54) MOUNTING TABLE STRUCTURE AND HEAT TREATMENT APPARATUS

(75) Inventor: Tomohito Komatsu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 763 days.

(21) Appl. No.: 12/336,207

(22) Filed: Dec. 16, 2008

(65) Prior Publication Data
US 2009/0095733 A1     Apr. 16, 2009

Related U.S. Application Data
(63) Continuation of application No. PCT/JP2007/060778, filed on May 28, 2007.

(30) Foreign Application Priority Data

Jun. 16, 2006 (JP) .............................. 2006-167576
Mar. 27, 2007 (JP) .............................. 2007-081949

(51) Int. Cl.
*H05B 3/06* (2006.01)
*H05B 3/68* (2006.01)

(52) U.S. Cl. ........................... 219/521; 219/444.1

(58) Field of Classification Search ............... 219/385, 219/390, 443.1, 444.1, 446.1, 521, 544, 546, 219/547, 548; 118/715, 723 VE, 724, 725; 432/247, 253
See application file for complete search history.

(56) References Cited

U.S. PATENT DOCUMENTS

| | | | |
|---|---|---|---|
| 5,280,156 A * | 1/1994 | Niori et al. ................. | 219/385 |
| 5,462,603 A * | 10/1995 | Murakami .................. | 118/719 |
| 5,665,166 A | 9/1997 | Deguchi et al. | |
| 6,035,101 A * | 3/2000 | Sajoto et al. .............. | 392/416 |
| 6,835,916 B2 * | 12/2004 | Ito et al. .................... | 219/444.1 |
| 7,299,566 B2 | 11/2007 | Komatsu | |
| 7,417,206 B2 * | 8/2008 | Nakamura ................ | 219/444.1 |
| 7,718,930 B2 | 5/2010 | Kawasaki et al. | |
| 2007/0095289 A1 | 5/2007 | Arami | |

FOREIGN PATENT DOCUMENTS

| | | |
|---|---|---|
| JP | 6-244143 A | 9/1994 |
| JP | 09-186112 * | 7/1997 |
| JP | 2001-102435 A | 4/2001 |
| JP | 2005-19479 A | 1/2005 |
| KR | 10-2005-0119684 | 12/2005 |
| KR | 10-0584189 | 5/2006 |

OTHER PUBLICATIONS

Korean Office Action issued Oct. 19, 2010, in Patent Application No. 10-2008-7030562.

* cited by examiner

*Primary Examiner* — Sang Paik
(74) *Attorney, Agent, or Firm* — Oblon, Spivak, McClelland, Maier & Neustadt, L.L.P.

(57) ABSTRACT

Provided is a mounting table structure having a replaceable heating plate by removably arranging the heating plate in a heating plate accommodating chamber. A mounting table structure is provided with a mounting table, which is arranged inside a processing chamber and mounts thereon a target object, for performing specified heat treatment to the target object, and a hollow supporting column which supports the mounting table by making the mounting table stand on a bottom portion of the processing chamber. The mounting table is provided with a heating plate having a heater composed of an electric heat source embedded in a heat-resistant material, and a heating plate accommodating chamber composed of a heat-resistant and corrosion-resistant material for removably receiving the heating plate. The heating plate accommodating container includes a container body having an opening, and a cover portion attached to the container body. Thus, the heating plate is permitted to be replaced.

24 Claims, 7 Drawing Sheets

MOUNTING TABLE STRUCTURE AND HEAT TREATMENT APPARATUS

This application is a Continuation Application of PCT International Application No. PCT/JP2007/060778 filed on May 28, 2007, which designated the United States.

FIELD OF THE INVENTION

The present invention relates to a heat treatment apparatus and a mounting table structure for a target object such as a semiconductor wafer or the like.

BACKGROUND OF THE INVENTION

In the manufacture of a semiconductor integrated circuit, various sheet-by-sheet processes such as a film forming process, an etching process, a heat treating process, a quality modification process and a crystallization process are repeatedly performed on a target object, e.g., a semiconductor wafer or the like, thereby forming a desired integrated circuit. While executing such processes, processing gases needed for the corresponding processes, e.g., a film formation gas or a halogen gas for the film forming process; an ozone gas or the like for the quality modification process; $O_2$ gas, an inert gas such as $N_2$ gas, or the like for the crystallization process, are respectively introduced into a processing chamber.

For example, in a sheet-by-sheet heat treatment apparatus for performing heat treatment on semiconductor wafers one by one, a mounting table incorporating therein, e.g., a resistance heater, is installed in a vacuum evacuable processing chamber. A semiconductor wafer is mounted on the top surface of the mounting table and is heated to a specified temperature (e.g., 100° C. to 1000° C.). In this state, a specified processing gas is introduced into the processing chamber to perform various heat treatments on the wafer under predetermined process conditions (see, e.g., Japanese Patent Laid-open Applications No. S63-278322, No. H07-078766, No. H03-220718, No. H06-260430, No. H08-78193 and No. 2004-356624). Therefore, those components arranged in the processing chamber are required to have heat-resistance with which the components resist the heating and corrosion-resistance with which the components are kept against corrosion even if they are exposed to the processing gases.

A mounting table structure for mounting thereon a semiconductor wafer is generally manufactured by thermally welding a mounting table together with a supporting column through, e.g., thermal diffusion bond technique. The mounting table is formed by embedding a resistance heater as a heating element in a ceramic material such as AlN or the like and then sintering them as a unit at a high temperature to ensure heat-resistance and corrosion-resistance and preventing metal contamination. The supporting column is also formed by sintering a ceramic material or the like in another process. The mounting table structure formed as a unit with the supporting column stands on a bottom portion of the processing chamber. Further, a quartz glass, which has heat-resistant and corrosion-resistance, may be used in place of the ceramic material.

Since the mounting table is formed by embedding the resistance heater as a heating element in the ceramic material or in the quartz glass and integrally sintering them as mentioned above, the mounting table structure as a whole has to be replaced with a new one only if a defect such as a partial fracture of the resistance heater or the like is generated in a part of the mounting table structure. This poses a problem in that the components other than the defective part also become useless.

Among the processes, there are a process particularly requiring a corrosion resistance, a process particularly requiring a resistance against a thermal shock and a process particularly requiring a resistance against metal contamination. Depending on the kinds of processes, there exist various specifications to comply with. In order to assure standardized use of parts, the mounting table structure is generally manufactured so as to cope with the most severe process in terms of the corrosion resistance, the heat resistance and the like. For that reason, depending on the kinds of processes used, a material having unnecessarily great resistances is selected as the material of the mounting table structure. Thus, the parts of the mounting table structure may suffer from over-specification. In particular, the parts having the increased resistances are costly to purchase and to process, so that an apparatus using the parts becomes expensive beyond necessity.

Since the supporting column is thermally bonded together with the bottom surface of the mounting table, the joint region of the mounting table and the supporting column exhibits increased heat conductivity, thus assuring superior heat transfer from the joint region to the supporting column. As a consequence, the joint region grows colder than the remaining portions of the mounting table, thereby creating a so-called cool spot where thermal stresses are concentrated. Therefore, the mounting table is easily cracked with the joint region as a starting point.

A thermocouple is attached to a rear surface of the mounting table in order to control the temperature of a heater of the mounting table. The thermocouple is attached after sintering the mounting table, and further, in order to prevent a detection line of the thermocouple from being exposed to a processing gas or other corrosive gases, only one thermocouple can be installed at the center portion of the rear surface of the mounting table to which the supporting column is joined. Therefore, there is no choice but to empirically find the temperature of the peripheral portion of the mounting table, although the temperature of the center portion of the mounting table can be measured by the thermocouple. For that reason, it may be impossible to keep improving the temperature uniformity of the mounting table or the in-plane temperature uniformity of the semiconductor wafer, in case where the heat radiation environment is changed to a great extent or in other cases.

When the resistance heater is integrally sintered in the mounting table, the pattern of the resistance heater is arranged in a calculated position with increased accuracy. However, the cross section of the resistance heater may be slightly deformed by the stresses generated during the sintering process. In this case, it is impossible to adjust the position of the resistance heater, which causes a difficulty to realize a temperature distribution as designed.

SUMMARY OF THE INVENTION

In view of the above, the present invention provides a mounting table structure in which a mounting table is constructed from a heating plate removably provided in a heating plate accommodating container so that the heating plate can be replaced, and a heat treatment apparatus using the mounting table structure.

Further, the present invention also provides a mounting table structure in which a conductive member serving as, e.g., a lower electrode or a chuck electrode, is not integrally sintered with a mounting table to permit repair thereof, and a heat treatment apparatus using the mounting table structure.

In accordance with the present invention, there is provided a mounting table structure including: a mounting table, arranged in a processing chamber, for mounting a target object thereon to perform a specified heat treatment on the target object; and a hollow supporting column for supporting the mounting table, the supporting column being standing on a bottom portion of the processing chamber.

Further, the mounting table includes: a heating plate including a heat-resistant material and a heater as an electric heat source embedded in the heat-resistant material; and a heating plate accommodating container made of a heat-resistant and corrosion-resistant material, the container including a container body with an opening for removably receiving the heating plate and a cover portion detachably attached to the opening of the container body.

The heating plate can be made replaceable by employing the mounting table in which the heating plate is removably received within the heating plate accommodating container.

Further, it is possible to replace the removable cover portion with a cover portion made of a material whose heat resistance and corrosion resistance correspond to the process to be performed. This makes it possible to keep the cover portion from suffering from over-specification. As a result, it is possible to use a relatively cheap and easy-to-process material, thereby greatly saving the manufacturing costs of an apparatus.

The cover portion may be engaged with the container body by means of an engaging pin made of a heat-resistant and corrosion-resistant material.

A seal member and/or a seal structure may preferably be provided in a joint region of the cover portion and the container body.

It is preferable that the heater is divided into a plurality of zones and is temperature-controllable on a zone-by-zone basis.

Also, a plurality of temperature measuring elements may be provided on a rear surface of the cover portion corresponding to the zones.

Further, each of the temperature measuring elements may preferably have a measuring line extending into the supporting column.

The supporting column may have a top end portion removably attached to a center region of a bottom surface of the mounting table by means of a bolt member.

Since the supporting column and the mounting table are detachably attached to each other according to the present invention, only one of the supporting column and the mounting table whichever is defective may be replaced with a new one without having to replace both in the event that a defect is generated in one of the supporting column and the mounting table. This makes it possible to reduce the maintenance costs. Furthermore, inasmuch as the mounting table or the supporting column can be replaced with a one made of a material whose heat resistance and corrosion resistance correspond to the process to be performed, it is possible to prevent the mounting table or the supporting column from suffering from over-specification. As a result, it is possible to use a relatively cheap and easy-to-process material, thereby greatly saving the manufacturing costs of an apparatus.

Further, the bolt member may be made of a heat-resistant material.

It is preferable that a seal member is provided in a joint region of the top end portion of the supporting column and the bottom surface of the mounting table.

The heating plate may include a line sealing pipe for sealingly enclosing a power supply line through which an electric power is supplied to the heater, the line sealing pipe being made of a heat-resistant material, the line sealing pipe extending into the supporting column through the container body.

Each of the supporting column and the heating plate accommodating container may have an inner space filled with an inert gas at a positive pressure.

A conductive member extending in a planar direction may preferably be embedded in the cover portion and a conductive line is connected to the conductive member, the conductive line extending into the supporting column.

A conductive member extending in a planar direction may also be provided on the heating plate and a conductive line is connected to the conductive member, the conductive line extending into the supporting column.

Further, a conductive member extending in a planar direction may be provided between the cover portion and the heating plate and a conductive line is connected to the conductive member, the conductive line extending into the supporting column.

With this mounting table structure, the conductive member is not integrally sintered with the cover portion. Therefore, the conductive member serving as a lower electrode or a chuck electrode can be repaired with ease when such a need arises.

The conductive member may be bonded to a bottom surface of the cover portion.

The conductive member may also be bonded to a top surface of the heating plate.

A protective layer made of a heat-resistant insulating material may be provided on a surface of the conductive member to cover the entire surface.

In accordance with the present invention, there is provided a mounting table structure including: a mounting table, arranged within a processing chamber, for holding a target object to perform a specified heat treatment on the target object; and a hollow supporting column for supporting the mounting table, the supporting column being standing on a bottom portion of the processing chamber.

Further, the mounting table includes: a heating plate including a heat-resistant material and a heater as an electric heat source embedded in the heat-resistant material; a heating plate accommodating container made of a heat-resistant anticorrosive material, the container including a container body with an opening for removably receiving the heating plate and a cover portion detachably attached to the opening of the container body; a conductive member provided on a top surface of the cover portion and extending in a planar direction; a protective layer provided to cover an entire surface of the conductive member, the protective layer being made of a heat-resistant insulating material; and a conductive line connected to the conductive member.

The heating plate can be made replaceable by employing the mounting table in which the heating plate is removably received within the heating plate accommodating container.

Furthermore, it is possible to replace the removable cover portion with a cover portion made of a material whose heat resistance and corrosion resistance correspond to the process to be performed. This makes it possible to keep the cover portion from suffering from over-specification. As a result, it is possible to use a relatively cheap and easy-to-process material, thereby greatly saving the manufacturing costs of an apparatus.

Furthermore, the conductive member is not integrally sintered with the cover portion, the conductive member serving as a lower electrode or a chuck electrode can be repaired with ease when such a need arises.

It is preferable that the protective layer is formed by coating the heat-resistant insulating material.

It is also preferable that the protective layer is formed by bonding a sheet made of a heat-resistant insulating material with an adhesive agent.

The cover portion may have a thickness falling within a range of 1 to 20 mm.

The heat-resistant material, and the heat-resistant and corrosion-resistant material may be composed of an insulating material.

The insulating material may be made of a ceramic material selected from the group consisting of quartz glass, AlN, $Al_2O_3$ and $Si_3N_4$.

In accordance with the present invention, there is provided a heat treatment apparatus including: a vacuum-evacuatable processing chamber; a mounting table structure arranged within the processing chamber; and a gas supply unit for supplying a specified processing gas into the processing chamber.

The mounting table structure includes: a mounting table, arranged within the processing chamber, for mounting a target object to perform a specified heat treatment thereon; and a hollow supporting column for supporting the mounting table, the supporting column being standing on a bottom portion of the processing chamber, Further, the mounting table includes: a heating plate including a heat-resistant material and a heater as an electric heat source embedded in the heat-resistant material; and a heating plate accommodating container made of a heat-resistant and corrosion-resistant material, the container including a container body with an opening for removably receiving the heating plate and a cover portion detachably attached to the opening of the container body.

In accordance with the present invention, there is provided a heat treatment apparatus including: a vacuum-evacuatable processing chamber; a mounting table structure arranged within the processing chamber; and a gas supply unit for supplying a specified processing gas into the processing chamber.

The mounting table structure includes: a mounting table, arranged within the processing chamber, for mounting a target object to perform a specified heat treatment thereon; and a hollow supporting column for supporting the mounting table, the supporting column being standing on a bottom portion of the processing chamber.

Further, the mounting table includes: a heating plate including a heat-resistant material and a heater as an electric heat source embedded in the heat-resistant material; a heating plate accommodating container made of a heat-resistant and corrosion-resistant material, the container including a container body with an opening for removably receiving the heating plate and a cover portion detachably attached to the opening of the container body; a conductive member provided on a top surface of the cover portion and extending in a planar direction; a protective layer provided to cover an entire surface of the conductive member, the protective layer being made of a heat-resistant insulating material; and a conductive line connected to the conductive member.

The mounting table structure and the heat treatment apparatus of the present invention are capable of providing the advantageous effects as follows.

The heating plate can be made replaceable by employing the mounting table in which the heating plate is removably received within the heating plate accommodating container.

Furthermore, it is possible to replace the removable cover portion with a cover portion made of a material whose heat resistance and corrosion resistance correspond to the process to be performed. This makes it possible to keep the cover portion from suffering from over-specification. As a result, it is possible to use a relatively cheap and easy-to-process material, thereby greatly saving the manufacturing costs of an apparatus.

Since the supporting column and the mounting table are detachably attached to each other according to the present invention, only one of the supporting column and the mounting table whichever is defective may be replaced with a new one without having to replace both in the event that a defect is generated in one of the supporting column and the mounting table. This makes it possible to reduce the maintenance costs. Furthermore, inasmuch as the mounting table or the supporting column can be replaced with a one made of a material whose heat resistance and corrosion resistance correspond to the process to be performed, it is possible to prevent the mounting table or the supporting column from suffering from over-specification. As a result, it is possible to use a relatively cheap and easy-to-process material, thereby greatly saving the manufacturing costs of an apparatus.

DETAILED DESCRIPTION OF THE EMBODIMENT

Embodiments of a mounting table structure and a heat treatment apparatus in accordance with the present invention will be described with reference to the accompanying drawings.

(First Embodiment)

Figure 1:
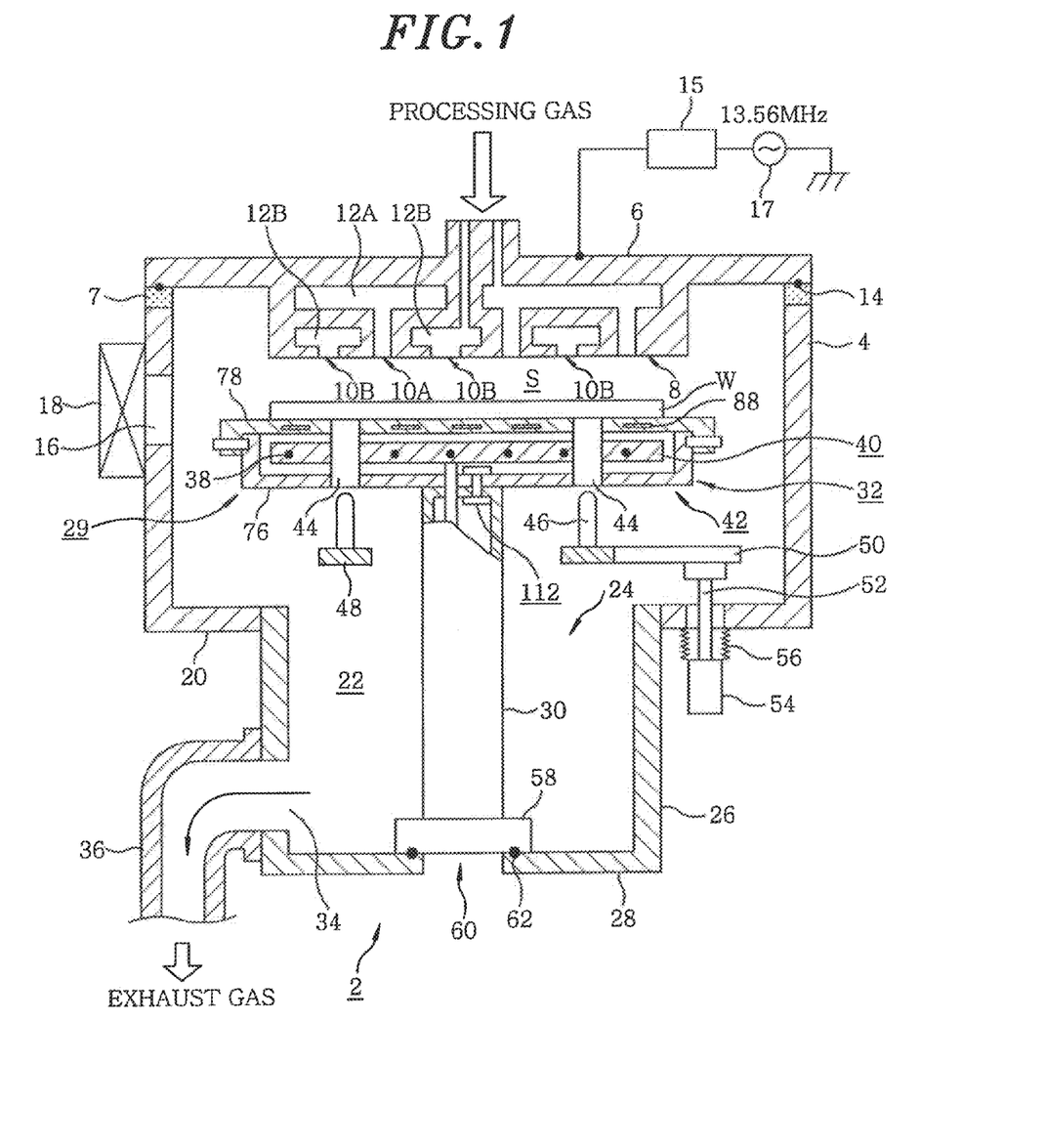
FIG. 1 is a sectional configuration view showing a heat treatment apparatus in accordance with the present invention.
Figure 2:
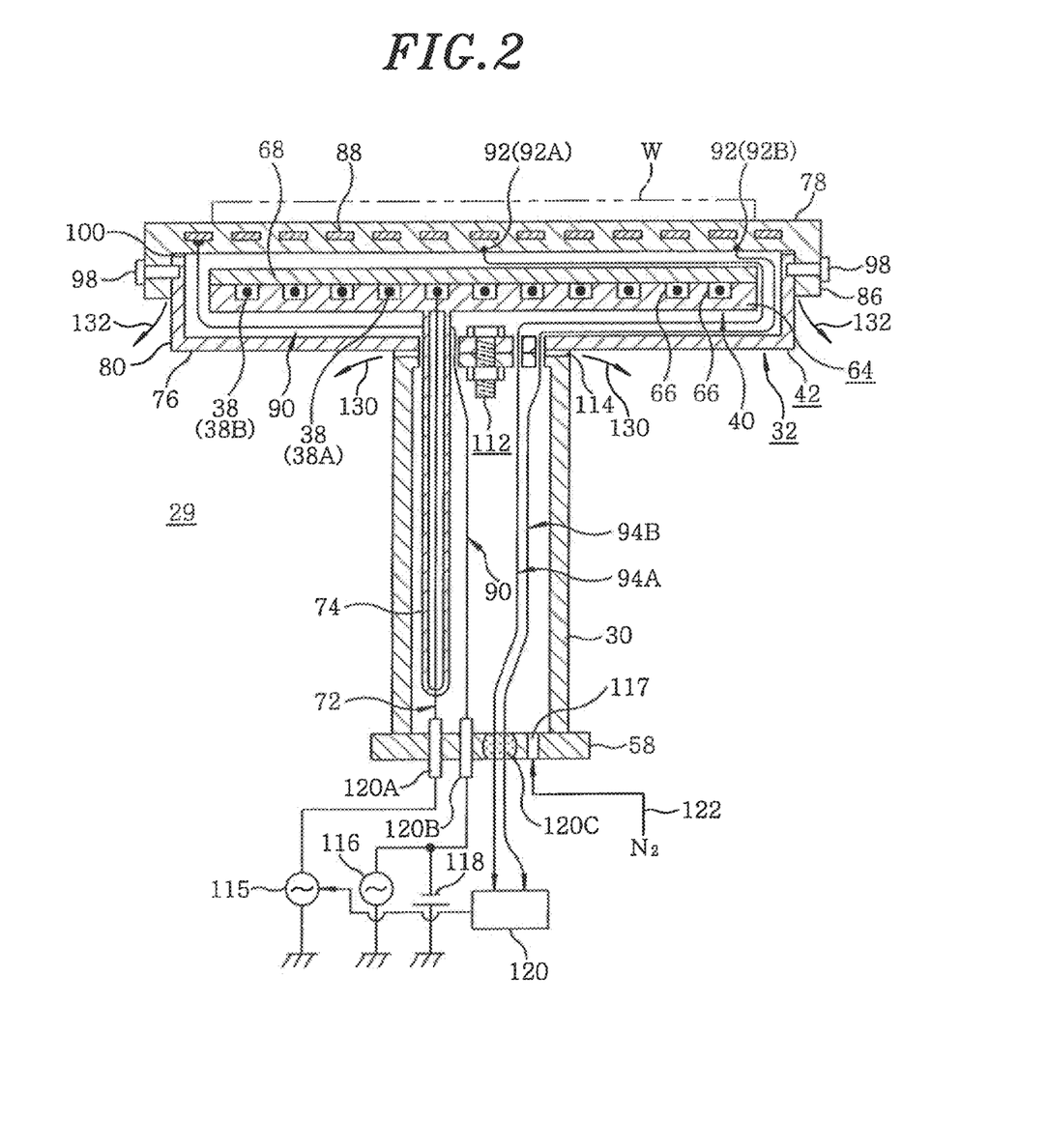
FIG. 2 is a sectional view showing a first embodiment of a mounting table structure.
Figure 3:
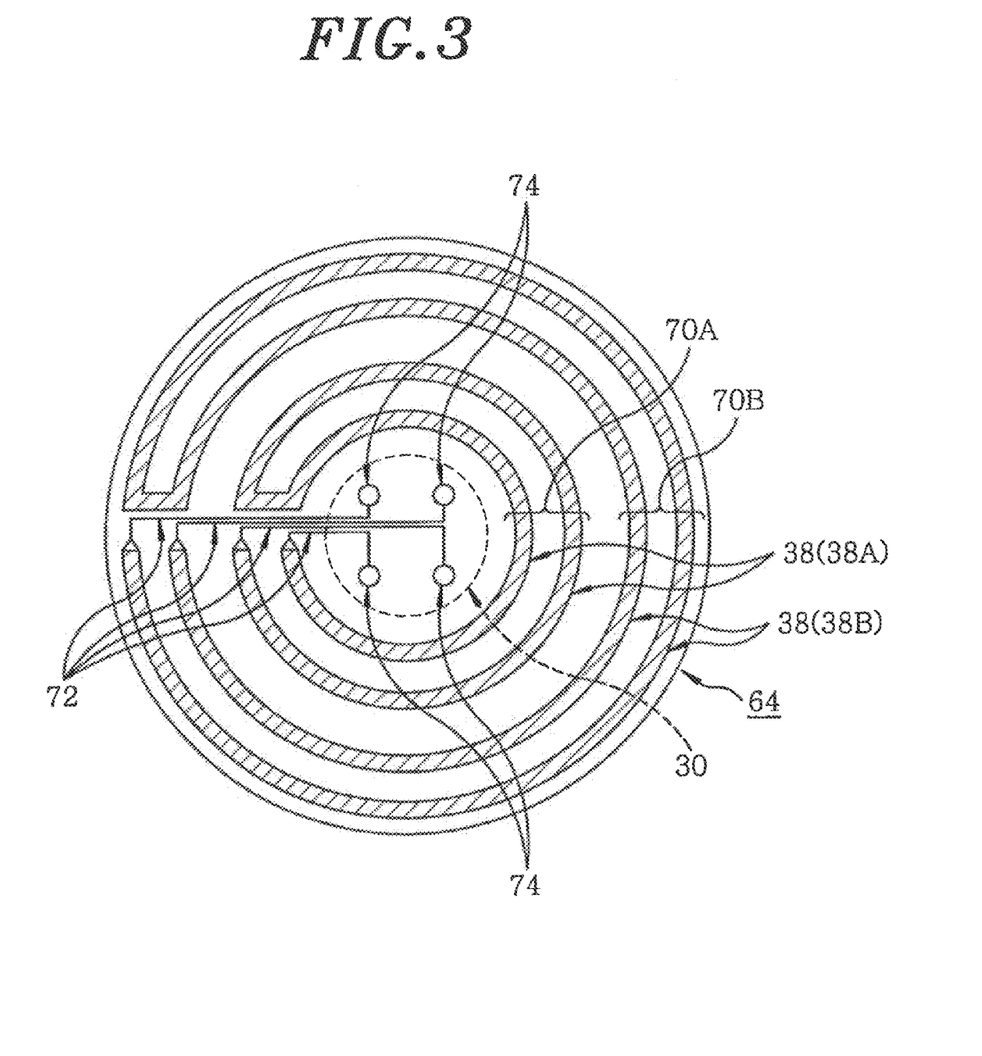
FIG. 3 is a plan view showing a heater of the mounting table structure.
Figure 4A:
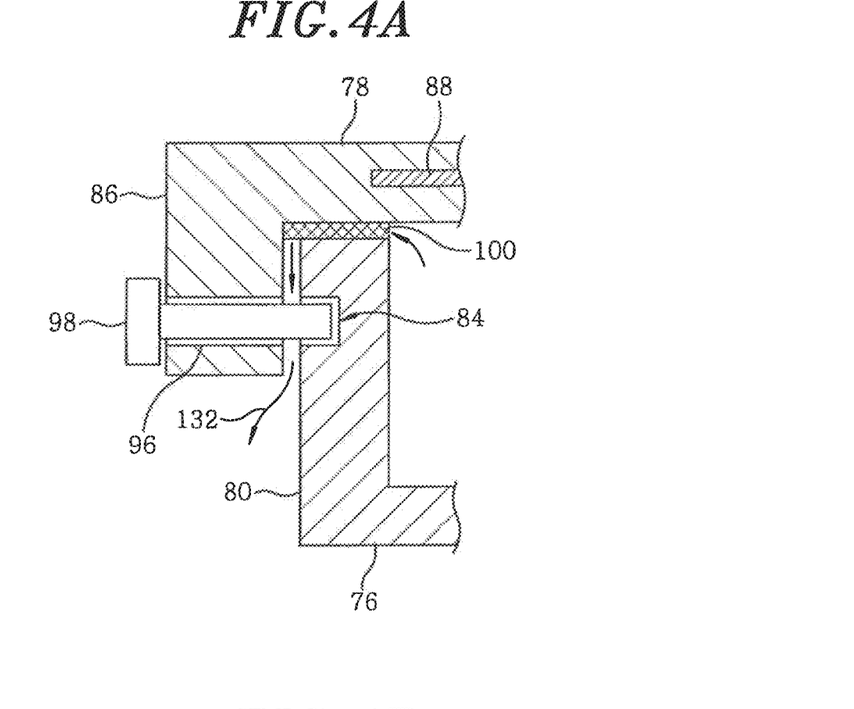
FIGS. 4A and 4B are partially enlarged sectional views illustrating some parts of the mounting table structure.
Figure 4B:
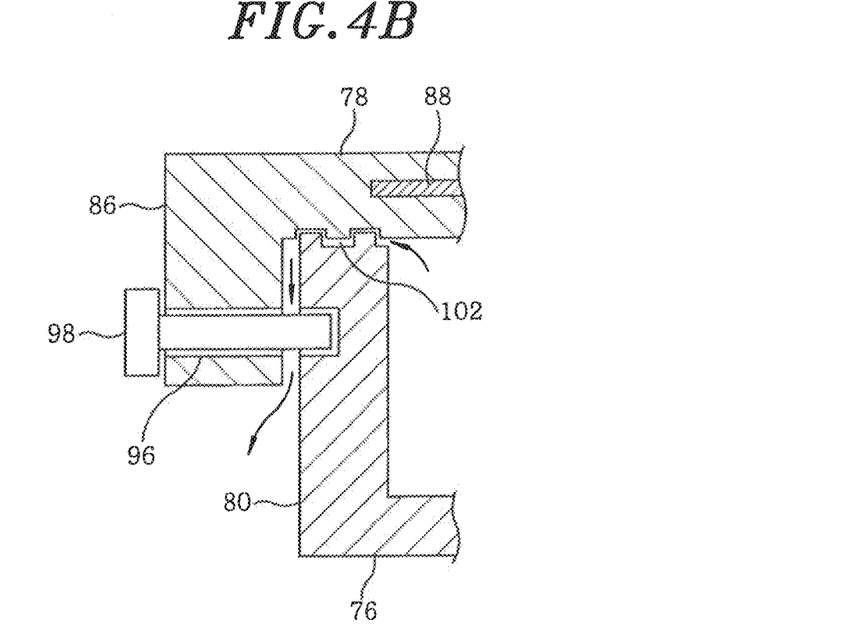
Figure 5:
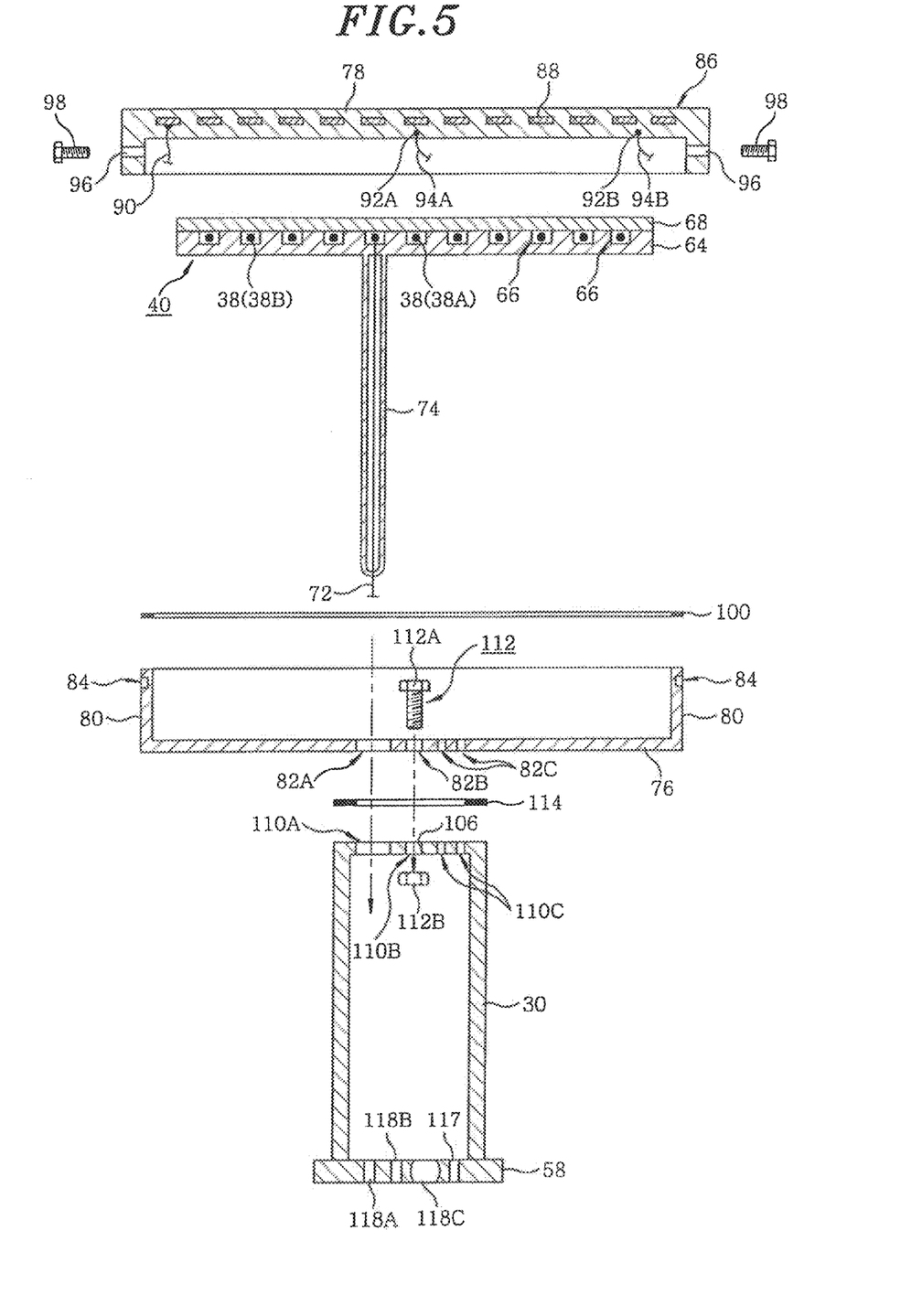
FIG. 5 is an exploded sectional view showing the mounting table structure.

FIG. 1 is a sectional configuration view showing a heat treatment apparatus in accordance with the present invention. FIG. 2 is a sectional view showing a first embodiment of a mounting table structure. FIG. 3 is a plan view showing a heater of the mounting table structure. FIGS. 4A and 4B are partially enlarged sectional views illustrating some parts of the mounting table structure. FIG. 5 is an exploded sectional view showing the mounting table structure. In the present embodiment, description will be made on a heat treatment apparatus that can use the plasma generated by high frequency power.

As shown in FIG. 1, the heat treatment apparatus 2 includes a processing chamber 4 made of aluminum, and an inside of the processing chamber 4 is approximately of a circular cross-section. Installed via an insulating layer 7 on a ceiling portion of the processing chamber 4 is a shower head 6 serving as a gas supply unit for introducing a required processing gas, e.g., a film forming gas. A gas injection surface 8 on a bottom surface of the shower head 6 has a plurality of gas injection holes 10A and 10B, so that the processing gas is injected through the gas injection holes 10A and 10B toward a processing space S. The shower head 6 also serves as an upper electrode for use in plasma processing.

Two hollow gas diffusion spaces 12A and 12B are independently formed inside the shower head 6. The processing gas introduced therein is diffused in a planar direction, and then is ejected through gas injection holes 10A and 10B respectively communicating with the gas diffusion spaces 12A and 12B. The gas injection holes 10A and 10B are arranged in a matrix pattern. The entire shower head 6 is formed of, e.g., nickel, a nickel alloy such as Hastelloy (registered trademark) or the like, aluminum or an aluminum alloy. The shower head 6 may have a single gas diffusion space. A seal member 14 formed of, e.g., an O-ring, is interposed between the shower head 6 and the insulating layer 7 arranged in the top opening of the processing chamber 4, thereby keeping the interior of the processing chamber 4 air-tight. A high frequency power supply 17 for plasma generation with a frequency of, e.g., 13.56 MHz, is connected to the shower head 6 via a matching circuit 15 so that plasma can be generated, if necessary. The frequency of the high frequency power supply 17 is not limited to 13.56 MHz.

Formed on a sidewall of the processing chamber 4 is a loading/unloading port 16 for loading and unloading a target object, e.g., a semiconductor wafer W, into and from the processing chamber 4. Installed at the loading/unloading port 16 is a gate valve 18 capable of being airtightly opened and closed.

Further, an exhaust gas downdraft space 22 is formed at a bottom portion 20 of the processing chamber 4. Specifically, a large opening 24 is provided at a central portion of the bottom portion 20 of the processing chamber 4, and the entrance opening 24 is connected to a downwardly extending cylindrical partition wall 26 of a cylindrical shape having a bottom surface. Accordingly, an inner space of the cylindrical partition wall 26 forms the exhaust gas downdraft space 22. A mounting table structure 29, one of the features of the present invention, is provided to stand on the bottom portion 28 of the cylindrical partition wall 26 that defines the exhaust gas downdraft space 22. To be specific, the mounting table structure 29 mainly includes a cylindrical supporting column 30 and a mounting table 32 removably secured to the upper end portion of the supporting column 30. The mounting table structure 29 will be described later in more detail.

The opening 24 of the exhaust gas downdraft space 22 has a diameter smaller than that of the mounting table 32. Thus, the processing gas, which flows down along an outer region of the periphery of the mounting table 32, curves inward the mounting table 32 and flows into the opening 24. On a bottom sidewall of the cylindrical partition wall 26, there is formed an exhaust port 34 leading to the exhaust gas downdraft space 22. An exhaust pipe 36 is connected to the exhaust port 34 where a vacuum pump (not shown) is installed, so that the atmosphere of the processing chamber 4 and the exhaust gas downdraft space 22 can be exhausted to vacuum.

A pressure control valve (not shown) whose opening can be controlled is installed in the midst of the exhaust pipe 36. By automatically controlling the opening degree of the pressure control valve, it is possible to maintain the pressure inside the processing chamber 4 constant or to rapidly change the pressure to a desired value.

The mounting table 32 includes a heating plate 40. As shown in FIG. 2, the heating plate 40 includes heat-resistant members 64 and 68 and a heater 38 formed of an electric heat source, e.g., a carbon wire heater arranged in a predetermined pattern, is embedded in the heat-resistant members 64 and 68. The heating plate 40 is received within a heating plate accommodating container 42. The semiconductor wafer W as a target object is mounted on the top surface of the heating plate accommodating container 42. Thus, the mounting table 32 serves as a heating unit.

The mounting table 32 is provided with a plurality of, e.g., three, pin insertion through holes 44 (only two are shown in FIG. 1, and the illustration thereof is omitted in the other drawings) vertically running therethrough. Upthrust pins 46 are loosely fitted into the pin insertion through holes 44 so that they can make vertical movement through the pin insertion through holes 44. A bottom portion of the upthrust pin 46 is connected to a ring-shaped upthrust ring 48 made of ceramic material such as alumina or the like. The lower portion of each upthrust pin 46 is mounted on or coupled to the upthrust ring 48. An arm unit 50 extending from the upthrust ring 48 is connected to an up/down rod 52 passing through the bottom portion 20 of the processing chamber 4, and the up/down rod 52 is configured to be vertically moved by an actuator 54.

Thus, the upthrust pins 46 are vertically moved up and down the top portion of the pin insertion through holes 44 when receiving or transferring the wafer W. Moreover, an expansible/contractible bellows 56 is installed at a portion where the up/down rod 52 of the actuator 54 penetrates the bottom portion 20 of the processing chamber. Accordingly, the up/down rod 52 can be vertically moved while keeping the inside of the processing chamber 4 airtight.

The bottom portion of the supporting column 30 of the mounting table structure 29 is closed. Further, a flange 58 having a larger diameter is provided on the corresponding bottom portion. The flange 58 is detachably attached to the bottom portion 28 of the cylindrical partition wall 26, by using bolts (not shown) or the like, to thereby cover a through hole 60 formed at the center of the bottom portion 28 of the cylindrical partition wall 26.

A seal member 62, e.g., an O-ring, is interposed between the flange 58 and the bottom portion 28 which corresponds to the peripheral portion of the through hole 60. Accordingly, the corresponding portion can be maintained airtight.

Hereinafter, the mounting table structure 29 will be described in detail with reference to FIGS. 2 to 5.

As set forth above, the mounting table structure 29 is mainly formed of the mounting table 32 and the supporting column 30. More specifically, the mounting table 32 is formed of the heating plate 40 and the heating plate accommodating container 42 for receiving the same. The heating plate 40 includes a disk-like base 64 made of a heat-resistant material. Heater grooves 66 are formed on the entire surface of the base 64. The heater 38 formed of an electric heat source is arranged in the heater grooves 66. Arranged on the top surface of the base 64 is a circular plate 68 made of a heat-resistant material. The base 64 and the circular plate 68 are sintered together as a unit at a high temperature. Thus, the heater 38 is embedded in the heating plate 40.

In this regard, the heater 38 is divided into a plurality of zones, and the temperature of the heater 38 can be controlled on a zone-by-zone basis. Specifically, in the present embodiment, the heater 38 is divided into two concentric zones, i.e., a heater 38A of an inner zone 70A and a heater 38B of an outer zone 70B as shown in FIG. 3. In FIG. 3, the number of winding of the respective heaters 38A and 38B is reduced for the sake of easier understanding of the drawings. The number of zones may be three or more.

Power supply lines 72 are connected to the opposite ends of each of the heaters 38A and 38B thus divided. The power supply lines 72 extend downwardly from the center portion of the rear surface of the heating plate 40. A part of the power supply lines 72 in a longitudinal direction thereof are airtightly sealed inside line sealing pipes 74 made of a heat-resistant material. The line sealing pipes 74 are welded together with the heating plate 40 at their top ends.

As a result, the line sealing pipes 74 penetrate the cylindrical supporting column 30 and extend downwardly. In this regard, the heat-resistant material includes, e.g., transparent quartz glass, which means that the heating plate 40 including the line sealing pipes 74 are all integrally formed with quartz glass. Although the line sealing pipes 74 are four in the present embodiment (see FIG. 3), only one line sealing pipe is illustrated in FIGS. 1 and 2 for the sake of simplicity.

Next, the heating plate accommodating container 42 includes a container body 76 having a top opening and made of a heat-resistant and corrosion-resistant material, e.g., aluminum nitride (AlN), and a cover portion 78 removably attached to the top opening of the container body 76 and made of a heat-resistant and corrosion-resistant material, e.g., aluminum nitride. The container body 76 has a sidewall 80 formed by upwardly bending the peripheral portion thereof. Therefore, the container body 76 is of an upwardly opened bowl shape. As shown in FIG. 5, in the center portion of the container body 76 corresponding to the joint region of the supporting column 30, there are provided through holes 82A for the line sealing pipes, a through hole 82B for a bolt and through holes 82C for a required number of other lines.

In this regard, the through holes 82A for the line sealing pipes has a diameter a little greater than the outer diameter of the line sealing pipes 74 so that the line sealing pipes 74 can be inserted and removed in a loose fit state. At a specified number of points on the upper region of the outer circumferential surface of the sidewall 80 of the container body 76, there are formed pin hole portions 84 (see FIG. 4) for partially receiving the below-mentioned pin members.

The cover portion 78 has a sidewall 86 formed by downwardly bending the peripheral portion thereof. The cover portion 78 covers the container body 76 in such a manner that the sidewall 86 thereof is overlapped with the sidewall 80 of the container body 76. The cover portion 78 has a planar top surface that constitutes a mounting surface on which the wafer W can be directly mounted. The cover portion 78 has a thickness that falls within a range of about 1 to 20 mm. If the thickness is smaller than 1 mm, the cover portion 78 do not have strength great enough to resist the pressure difference developed between the interior of the heating plate accommodating container 42 and the processing space outside the heating plate accommodating container 42. If the thickness is greater than 20 mm, the impedance in the cover portion 78 is overly increased, thereby increasing the plasma potential.

A net-like conductive member 88 extending in a planar direction is integrally embedded in the cover portion 78. A downwardly extending conductive line 90 is connected to the conductive member 88. The conductive member 88 may be formed of a mesh-like member, a member of punched plate shape having a plurality of holes distributed in a sheet, a thinly coated conductive layer, a member having a conductive pattern printed in many different forms, and so forth. The cover portion 78 is made of quartz or a ceramic material such as $Al_2O_3$, AlN or the like and is integrally sintered with the conductive member 88.

A plurality of temperature measuring elements 92 is embedded in the rear surface of cover portion 78 at different radial positions. More specifically, a plurality of, i.e., two, temperature measuring elements 92A and 92B are provided corresponding to the number of zones of the heater 38. The temperature measuring element 92A is provided in the center portion of the cover portion 78 to measure the temperature of the inner zone, and the temperature measuring element 92B is provided in the peripheral portion of the cover portion 78 to measure the temperature of the outer zone. It is possible to use, e.g., thermocouples, as the temperature measuring elements 92A and 92B. The temperature measuring elements 92A and 92B are attached to the cover portion 78 by glass fusion bonding, brazing, screw fixing, spring biasing or integral sintering with the cover portion 78. Measuring lines 94A and 94B extend downwardly from the temperature measuring elements 92A and 92B.

On the sidewall 86 of the cover portion 78, a plurality of pin holes 96 communicating with the pin hole portions 84 of the sidewall 80 of the container body 76 is formed at a specified number of points (see FIG. 4A). Engaging pins 98 are removably inserted into the pin holes 96 and the pin hole portions 84. Therefore, the cover portion 78 can be detached from the container body 76 by removing the engaging pins 98. As a material of which the engaging pins 98 are made, it is possible to use a heat-resistant and corrosion-resistant material, e.g., quartz glass or a ceramic material. In this case, the engaging pins 98, the pin holes 96 and the pin hole portions 84 may be threaded to assure reliable engagement of the engaging pins 98.

The present invention is not limited to the attachment structure mentioned above, insofar as the cover portion 78 is provided in a removably attached manner. For example, a ring-shaped resilient retainer partially notched and made of a heat-resistant and corrosion-resistant material, e.g., AlN, may be provided along the sidewall 86 to ensure that the engaging pins 98 are held against removal by the resilient force of the resilient retainer.

A seal member 100 (see FIG. 4A) is provided in the contact portion between the cover portion 78 and the container body 76. In the present embodiment, the seal member 100 is of a thin annular shape and is interposed between the top end surface of the sidewall 80 of the container body 76 and the peripheral region of the bottom surface of the cover portion 78. The seal member 100 may be a ring-shaped gasket made of, e.g., nickel. This sealing point does not require as high sealability as is offered by an O-ring or the like. Infiltration of a gas into the heating plate accommodating container 42 can be prevented by keeping the interior of the container 42 at a positive pressure with an inert gas. In place of or in combination with the seal member 100, it may be possible to provide a seal structure 102 having a labyrinth of prominences and depressions shape as shown in FIG. 4B.

In the meantime, the supporting column 30 is formed into a hollow cylindrical shape by using a heat-resistant and corrosion-resistant material, e.g., aluminum oxide ($Al_2O_3$). The upper end portion of the supporting column 30 is closed by a ceiling plate 106 and the lower end portion thereof is closed by the flange 58. As in the center portion of the rear surface of the container body 76, through holes 110A for the line sealing pipes, a through hole 110B for a bolt and through holes 110C for a required number of other lines are formed in the ceiling plate 106 (see FIG. 5).

The container body 76 and the supporting column 30 are removably attached to each other by means of a bolt member 112. Specifically, the bolt member 112 includes a bolt 112A inserted into the through hole 82B of the container body 76 and the through hole 110B of the ceiling plate 106 and a nut 112B tightened to the bolt 112A. By tightening the nut 112B to the bolt 112A, the container body 76 and the supporting column 30 are removably attached and fixed to each other. In this regard, the bolt member 112 is made of a heat-resistant material, e.g., silicon nitride ($Si_3N_4$). In performing the attachment, a thin annular seal member 114 (see FIG. 5) is interposed between the container body 76 and the ceiling plate 106. The seal member 114 may be a ring-shaped gasket made of, e.g., nickel. This sealing point does not require as high sealability as is offered by an O-ring or the like.

The line sealing pipes 74 of the heating plate 40 extend downwardly into the supporting column 30 through the through holes 82A and 110A for the line sealing pipes. The conductive line 90 extending from the conductive member 88 is inserted into the supporting column 30 through an empty space of the through holes 82A and 110A for the line sealing pipes (see FIG. 2). The measuring lines 94A and 94B extending from the temperature measuring elements 92A and 92B are inserted into the supporting column 30 through the through holes 82C and 110C.

As shown in FIG. 5, a gas inlet opening 117 and a plurality of, three in the illustrated example, of through holes 118A, 118B and 118C for lines are formed in the flange 58 of the supporting column 30. The power supply lines 72 extending from the lower ends of the line sealing pipes 74 are air-tightly inserted into the through hole 118A through a seal member 120A. The conductive line 90 is air-tightly inserted into the through hole 118B through a seal member 120B. The two measuring lines 94A and 94B are air-tightly inserted into the through hole 118C through a seal member 120C. An inert gas supply system 122 for supplying an inert gas is connected to the gas inlet opening 117 so that an inert gas can be supplied at a controlled flow rate, if necessary. Although an $N_2$ gas is used as the inert gas in the present embodiment, it may be possible to use other inert gases such as an Ar gas, an He gas and the like in place of the $N_2$ gas.

A heater power supply 115 is connected to the power supply lines 72 to independently heat the heaters 38A and 38B at a controlled temperature on a zone-by-zone basis. A high frequency bias power supply 116 is connected to the conductive line 90, thereby allowing the conductive member 88 to serve as a lower electrode during plasma processing. A frequency of the high frequency power supply 116 is, e.g., 13.56 MHz. A DC power supply 118 for an electrostatic chuck is connected to the conductive line 90, thereby allowing the conductive member 88 to serve as a chuck electrode. This makes it possible for the mounting table 32 to electrostatically attract the wafer W mounted thereon. When there is no need to use an electrostatic chuck or when plasma processing is not performed, the DC power supply 118 or the high frequency power supply 116 is not connected to the conductive line 90, and the conductive line 90 is merely grounded and used as a grounding line.

The two measuring lines 94A and 94B are connected to a temperature control unit 120. The temperature control unit 120 independently controls the temperature of the respective zones by controlling the heater power supply 115 depending on the temperature of the respective zones detected. Referring again to FIG. 1, the pin insertion through holes 44 are formed in the mounting table 32. In order to keep the interior of the heating plate accommodating container 42 sealed against the pin insertion through holes 44, a seal member, e.g., a gasket (not shown), for surrounding the pin insertion through holes 44 is interposed between a surface of the heating plate 40 and the inner surface of the heating plate accommodating container 42.

Next, description will be made on the operation of the plasma-using heat treatment apparatus configured as above.

First, a semiconductor wafer W to be processed is held by a transfer arm (not shown) and is loaded into the processing chamber 4 through the open gate valve 18 and the loading/unloading port 16. After the wafer W is transferred on top of the upthrust pins 46 that has been lifted, the upthrust pins 46 are lowered down whereby the wafer W is mounted on the top surface of the mounting table 32, more particularly, the top surface of the cover portion 78. At this time, a DC voltage is applied from the DC power supply 118 to the conductive member 88 of the mounting table 32 so that the electrostatic chuck can work to hold the wafer W on the mounting table 32.

Next, various processing gases are supplied to the shower head 6 at respective controlled flow rates. These gases are injected through the gas injection holes 10A and 10B and introduced into the processing space S. Further, a vacuum pump (not shown) provided at the exhaust pipe 36 is kept operating continuously to maintain the vacuum state in the processing chamber 4 and the exhaust gas downdraft space 22. By controlling an opening degree of the pressure control valve, the atmosphere of the processing space S can be maintained at a predetermined processing pressure. At this time, the temperature of the wafer W is maintained at a predetermined process temperature. Specifically, the heater 38 of the mounting table 32 is heated by a voltage applied from the heater power supply 115 and, thus, the entire heating plate 40 is heated.

As a result, the wafer W is heated to an increased temperature by the heat emitted from the heating plate 40. At this time, the temperature of the wafer W is measured by the temperature measuring elements 92A and 92B provided in the cover portion 78. Based on the measured values, the heaters 38A and 38B are controlled by the temperature control unit 120 on a zone-by-zone basis. Consequently, it is possible to control the temperature of the wafer W in such a state that the in-plane temperature uniformity at a high level is assured at all times.

When plasma processing is performed, the high frequency power supply 17 is operated to apply a high frequency to between the shower head 6 as an upper electrode and the mounting table 32 as a lower electrode. Thus, plasma is generated in the processing space S, and a specified plasma processing is carried out. At this time, the plasma ions can be attracted by applying a high frequency from the high frequency bias power supply 116 to the conductive member 88 of the mounting table 32.

During the specified plasma processing, an inert gas, e.g., an $N_2$ gas, is supplied into the supporting column 30 and the heating plate accommodating container 42 of the mounting table 32, thereby keeping the interior of the supporting column 30 and the heating plate accommodating container 42 at a positive pressure a little higher than the pressure developed within the processing chamber 4. Specifically, the $N_2$ gas supplied from the inert gas supply system 122 is introduced into the supporting column 30. The $N_2$ gas is also supplied into the heating plate accommodating container 42 through the through holes 82A and 110A and the through holes 82C and the 110C. Since the pressure of the $N_2$ gas is kept positive, the $N_2$ gas is leaked out into the processing space S little by little through a small gap of the seal member 114 provided in the joint region of the supporting column 30 and the mounting table 32 or a small gap of the seal member 100 provided in the joint region of the container body 76 and the cover portion 78, as indicated by arrows 130 and 132 in FIGS. 2 and 4.

Therefore, it is possible to prevent the processing gas or the corrosive gas used in the process, particularly the etching gas or the cleaning gas used in a cleaning process, from infiltrating into the supporting column 30 or the heating plate accommodating container 42. In case where the seal structure 102 of labyrinth shape is employed in those portions in which the seal members 100 and 114 are provided, if the pressure of the $N_2$ gas is set to be, e.g., 10 Torr (1333 Pa) or greater, the pressure within the supporting column 30 or the heating plate accommodating container 42, which also depends on the process pressure, can be kept at a value slightly greater than the critical pressure ratio (0.55) relative to the pressure within the processing chamber 4. This ensures that the flow velocity within the seal structure 102 of labyrinth shape becomes equal to the sound velocity, thereby preventing the processing gas or other gases to flow backward.

Since the components of the mounting table structure 29 are removably assembled together, a defective member is only replaced with a new one when a defect is generated in a part of the mounting table structure 29. For example, when the heater 38 is disconnected, only the heating plate 40 including the heater 38 is replaced with a new one by pulling out the engaging pins 98 and releasing the cover portion 78. This means that the supporting column 30 and the heating plate accommodating container 42 can be used as they are. Similarly, when a defect (including the consumption of a material caused by etching) is generated in the heating plate accommodating container 42 or the supporting column 30, the bolt member 112 is removed to dismantle the heating plate accommodating container 42 and the supporting column 30. Then, the heating plate accommodating container 42 or the supporting column 30 is replaced with a new one.

One of quartz glass and a ceramic material including AlN, $Al_2O_3$ and $Si_3N_4$ may be used as the insulating material, i.e., the heat-resistant and corrosion-resistant material or the heat-resistant material, of which the afore-mentioned components are made.

In this case, the components of identical shape each made of an optimal one of the above-noted materials is interchangeably used depending on the kinds of processes such as a process particularly requiring a corrosion resistance, a process particularly requiring a resistance against a thermal shock and a process particularly requiring a resistance against contamination. This makes it possible to realize a mounting table structure that can be used in various processes with the same design. Since the heater 38 is received in and along the heater grooves 66 of the heating plate 40, it is possible to prevent deformation of the heater 38 which would otherwise occur when integrally forming the same. Thus, the heater 38 can be formed with the size as designed.

Since the mounting table 32 and the supporting column 30 are removably coupled together by means of the bolt member 112, they exhibits increased thermal resistance as compared to the conventional apparatus in which a mounting table and a supporting column are thermally bonded. As a consequence, it becomes possible to prevent occurrence of cool spots. To that extend, it is possible to prevent occurrence of damage in the mounting table 32 and the supporting column 30 which would otherwise be caused by thermal shocks (or concentrated thermal stresses). It is also possible to easily perform sintering and machining of these components. Instead of using the bolt member 112, it may be possible to use other removable coupling members, e.g., a coupling member that includes a recess portion provided in the container body 76 and a protrusion portion provided in the supporting column 30 for engagement with the recess portion. The recess portion and the protrusion portion may be reversely provided.

Further, no processing gas is infiltrated into the heating plate accommodating container 42, it may be possible to arrange the temperature measuring elements 92 in a region other than the center region and at plural points (three or more points as a whole) of the mounting table 32. This makes it possible to control the temperature with increased accuracy.

While the conductive member 88 is embedded in the cover portion 78 according to the foregoing embodiment, the present invention is not limited thereto. Alternatively, the conductive member 88 may be formed on the heating plate 40 to extend in the planar direction of the heating plate 40. In this case, a thin conductive member extending in a disk-like pattern may be used in place of the mesh-like member.

(Second Embodiment)

Hereinafter, description will be made on a second embodiment which is directed to structural improvements of the conductive member 88.

With the mounting table structure 29 of the first embodiment described above, the conductive member 88 is embedded in a ceramic material composed of $Al_2O_3$ or the like and is integrally sintered therewith. Due to the fact that the conductive member 88 serving as a lower electrode or a chuck electrode is embedded in the ceramic material, it is quite difficult or impossible to repair the shape or the material of the conductive member 88. Moreover, since the conductive member 88 is sintered at a high temperature of, e.g., about 1900° C., only a high melting temperature metal such as W (tungsten) or Mo (molybdenum) can be used as a material of the conductive member 88. This often imposes restriction on the choice of an electrode material.

The conductive member 88 is embedded in a soft ceramic material prior to sintering and then hardened by baking them together. However, the conductive member 88 may undergo differential settlement in the soft ceramic material prior to baking and hardening. Consequently, the conductive member 88 is not embedded at a uniform in-plane depth, and variations occur in the embedment depth of the conductive member 88. For that reason, the electrostatic capacity between the conductive member 88 and the plasma formed thereon may become uneven, thereby adversely affecting the formation of plasma.

In order to electrically energize the conductive member 88, it is necessary to form a contact hole extending from the bottom surface of the ceramic-made cover portion 78 to the conductive member 88. However, cracks or the like may occur with the contact hole as a starting point.

Figure 6:
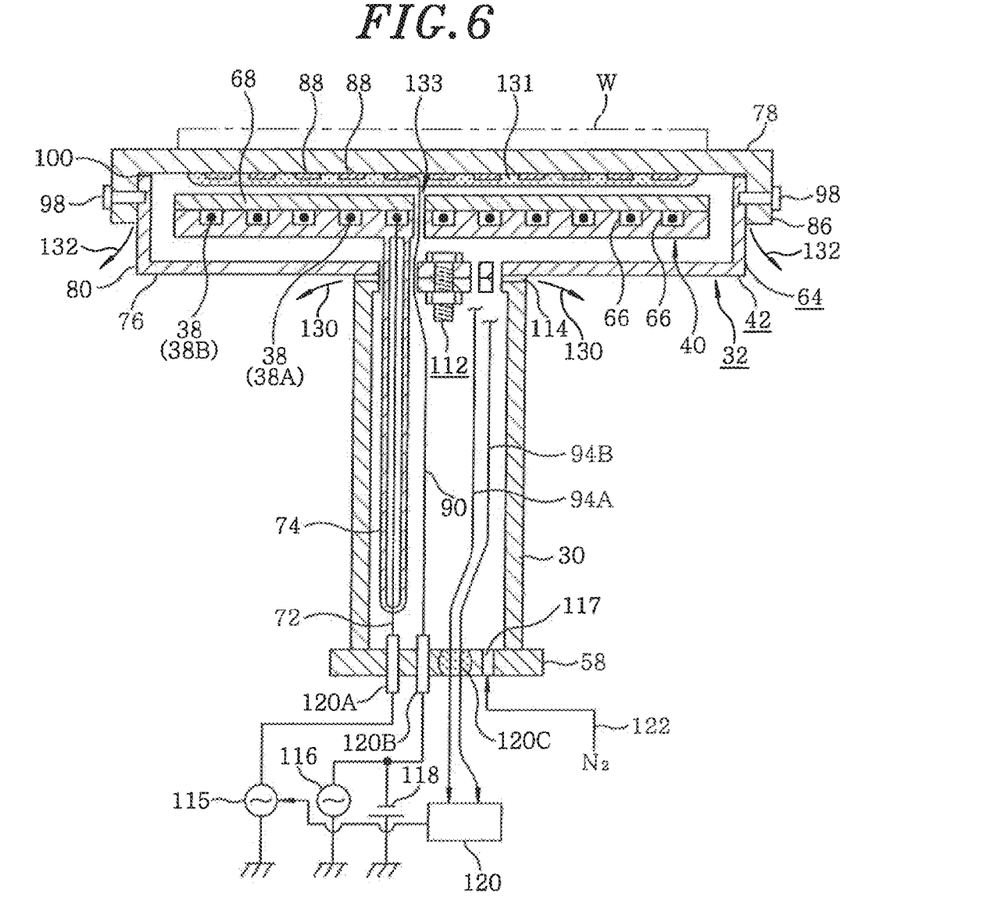
FIG. 6 is a sectional view showing a second embodiment of the mounting table structure in accordance with the present invention.

The second embodiment of the present invention is constructed to provide a solution to the problems mentioned above. FIG. 6 is a sectional view showing the second embodiment of the mounting table structure in accordance with the present invention. Here, like reference numerals will be used for like parts identical to those described in FIGS. 1 and 2, and redundant description thereof will be omitted. In FIG. 6, the temperature measuring elements 92 are omitted from illustration.

In the present embodiment, the conductive member 88 is not integrally sintered with the ceramic-made cover portion 78 but is provided between the cover portion 78 and the heating plate 40 lying therebelow. Specifically, as shown in FIG. 6, the conductive member 88 is directly bonded to the bottom surface (rear surface) of the cover portion 78 made of a sintered ceramic material or quartz glass. In this case, it is preferred that, for the purpose of preventing metal contamination, a protective layer 131 made of a heat-resistant insulating material is provided to cover the entire surface (the entire bottom surface in FIG. 6) of the conductive member 88.

As in the foregoing embodiment, a conductive line 90 extending from the conductive member 88 is arranged to pass through the supporting column 30. A through hole 133 is formed in the heating plate 40. The conductive line 90 extends downwardly through the through hole 133. The conductive member 88 may be made of a conductive inter-metal compound such as $MoSi_2$, $Ti_2AlC$, $Ti_3SiC_2$ or the like, as well as a high melting point metal such as W (tungsten), Mo (molybdenum) or the like.

In this regard, the conductive member 88 is bonded to the bottom surface of the cover portion 78 after grinding the latter into a planar shape. At this time, the conductive member 88 may be either bonded to or screen-printed on the bottom surface of the cover portion 78.

Figure 7:
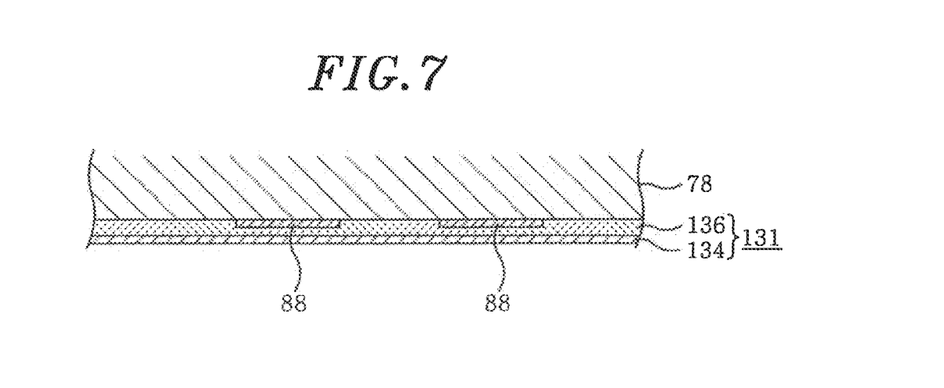
FIG. 7 is a partially enlarged sectional view illustrating a modified example of the second embodiment of the mounting table structure.

The protective layer 131 may be constructed by: applying a heat-resistant material, e.g., alumina ($Al_2O_3$) or yttrium oxide ($Y_2O_3$), with a thermal spraying method; diffusion-bonding a liquid phase material or a solid phase material; or bonding a sheet 134 made of alumina or yttrium oxide with an adhesive agent 136, as can be seen from the partially enlarged view of the cover portion illustrated in FIG. 7. In this case, carbon, $SiO_2$ or the like may be used as the adhesive agent 136.

As in the first embodiment, the cover portion 78 has a thickness that falls within a range of about 1 to 20 mm. If the thickness is smaller than 1 mm, the cover portion 78 do not have strength great enough to resist the pressure difference developed between the interior of the heating plate accommodating container 42 and the processing space outside the heating plate accommodating container 42. If the thickness is greater than 20 mm, the impedance in the cover portion 78 is overly increased, thereby increasing the plasma potential.

The second embodiment is capable of providing the same advantageous effects as is available in the first embodiment. Since the conductive member 88 is not integrally sintered with the ceramic-made cover portion 78 but is bonded to the bottom surface of the cover portion 78, the protective layer 131 or the conductive member 88 can be relatively easily removed the conductive member 88 needs to repair, or if the material needs to change. This makes it possible to easily perform the repairing task or the material changing task.

Inasmuch as the bottom surface of the cover portion 78 is grinded into a planar shape prior to bonding the conductive member 88, it is possible to form the conductive member 88 in a uniform and planar pattern. This makes it possible to increase the in-plane uniformity of the electrostatic capacity between the conductive member 88 and the plasma formed thereon, thereby avoiding adverse affect on the formation of plasma.

Furthermore, there is no need to form a contact hole through which the conductive line 90 extends in the cover portion 78, which would otherwise be needed in order to electrically energize the conductive member 88 through the conductive line 90. Therefore, it is possible to greatly reduce the possibility that damage is caused to the cover portion 78.

In addition, since the entire conductive member 88 is covered with the protective layer 131, there is no possibility that an inert gas such as a $N_2$ gas or the like flowing through the heating plate accommodating container 42 comes into direct contact with the conductive member 88. Therefore, even if the $N_2$ gas is leaked out into the processing space S, it is possible to prevent the wafer from being contaminated with a metal.

(Third Embodiment)

Next, description will be made on a third embodiment of the mounting table structure. While the conductive member 88 is bonded to the bottom surface of the cover portion 78 in the second embodiment, the present invention is not limited thereto. Alternatively, the conductive member 88 may be bonded to the top surface of the heating plate 40.

Figure 8:
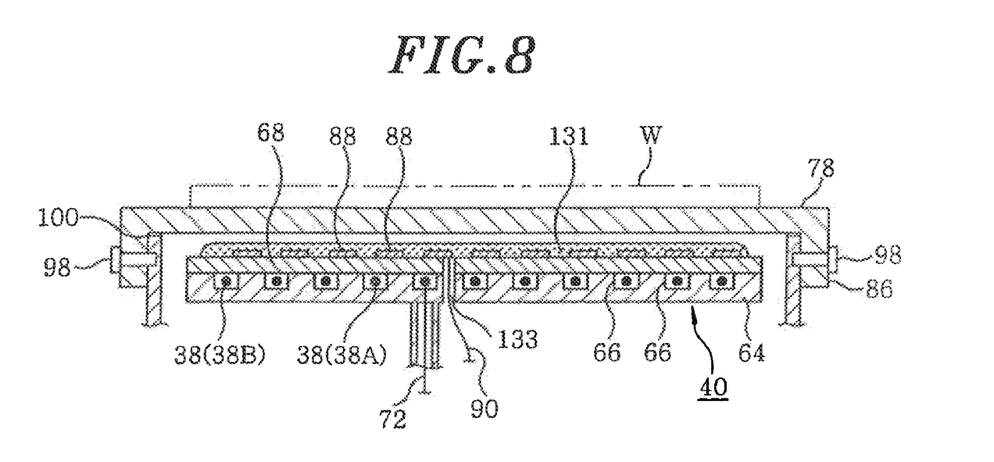
FIG. 8 is a partial section view showing a third embodiment of the mounting table structure in accordance with the present invention.

FIG. 8 is a partial section view showing the third embodiment of the mounting table structure in accordance with the present invention. Here, like reference numerals will be used for like parts identical to those described in FIGS. 1 and 6, and redundant description thereof will be omitted.

Referring to FIG. 8, the conductive member 88 is bonded to the top surface of the circular plate 68 that forms the upper portion of the heating plate 40. In this case, the conductive member 88 is bonded to the top surface of the circular plate 68, after the top surface of the circular plate 68 has been grinded into a planar surface as is done for the bottom surface of the cover portion 78 in the second embodiment described earlier. It is preferred that the protective layer 131 is formed to cover the entire top surface of the conductive member 88.

The method of bonding the conductive member 88 is the same as that of the second embodiment in that the thermal spraying method or the like is used. As described earlier with reference to FIG. 7, the conductive member 88 may be bonded using the sheet 134 and the adhesive agent 136.

The third embodiment is also capable of providing the same advantageous effects as is available in the second embodiment described above.

(Fourth Embodiment)

Next, description will be made on a fourth embodiment of the mounting table structure. While the conductive member 88 is provided between the cover portion 78 and the heating plate 40 in the second and the third embodiment, the present invention is not limited thereto. Alternatively, the conductive member 88 may be provided on the top surface of the cover portion 78.

Figure 9:
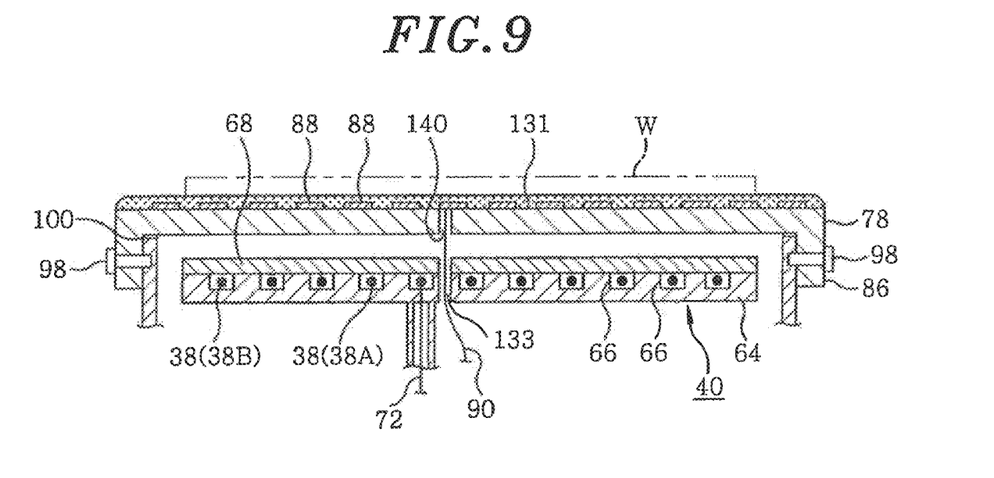
FIG. 9 is a partial section view showing a fourth embodiment of the mounting table structure in accordance with the present invention.

FIG. 9 is a partial section view showing the fourth embodiment of the mounting table structure in accordance with the present invention. Here, like reference numerals will be used for like parts identical to those described in FIGS. 1 and 6, and redundant description thereof will be omitted.

Referring to FIG. 9, the conductive member 88 is bonded to the top surface of the cover portion 78. In this case, the conductive member 88 is bonded to the top surface of the cover portion 78, after the top surface of the cover portion 78 has been grinded into a planar surface as is done for the bottom surface of the cover portion 78 in the second embodiment described earlier. Since the conductive member 88 is directly exposed to the processing space S of corrosive gas atmosphere, the protective layer 131 is formed to cover the entire top surface of the conductive member 88 to thereby prevent corrosion thereof.

The method of bonding the conductive member 88 is the same as that of the second embodiment in that the thermal spraying method or the like is used. As described earlier with reference to FIG. 7, the conductive member 88 may be bonded using the sheet 134 and the adhesive agent 136. In case of the fourth embodiment, a through hole 140 is formed in the cover portion 78, and a conductive line 90 is inserted into the through hole 140 and connected to the conductive member 88.

The fourth embodiment is also capable of providing the same advantageous effects as is available in the second embodiment described above. In case of the fourth embodiment, the distance between the conductive member 88 and the wafer W mounted thereon or the plasma becomes very short, which makes it possible to increase the working efficiency of plasma proportionately.

While the heating plate 40 includes the heater 38 integrally embedded in and sintered with the disk-like quartz glass according to the respective embodiments described above, the present invention is not limited thereto. For example, it may be possible to use a heating plate 40 in which a heater (e.g., a carbon wire heater) is inserted into a curved quartz glass tube of serpentine or spiral shape.

While the heat treatment apparatus described above is of the type using plasma, the present invention may be applied to a simple heat treatment apparatus that does not use plasma. In this case, there is no need to use the high frequency power supply 17 for the generation of plasma, the matching circuit 15 and the high frequency bias power supply 116. Even in such an instance, it is desirable to use the conductive member 88 serving as an electrostatic chuck.

Further, although a semiconductor wafer is used as an example of a target object in the above embodiments, it is not limited thereto. An LCD substrate, a glass substrate or the like can also be used as a target object.

What is claimed is:

1. A mounting table structure comprising:
   a mounting table, arranged in a processing chamber, for mounting a target object thereon to perform a specified heat treatment on the target object; and
   a hollow supporting column for supporting the mounting table, the supporting column being standing on a bottom portion of the processing chamber,
   wherein the mounting table includes: a heating plate including a heat-resistant material and a heater as an electric heat source embedded in the heat-resistant material; and a heating plate accommodating container made of a heat-resistant and corrosion-resistant material, the container including a container body with an opening for removably receiving the heating plate and a cover portion detachably attached to the opening of the container body,
   wherein the cover portion has a sidewall extending downwardly, so that the cover portion covers the container body such that the sidewall of the cover portion is overlapped with a sidewall of the container body, and
   wherein pin holes are formed at the sidewall of the cover portion and pin hole portions communicating with the pin holes are formed at the sidewall of the container body, and engaging pins are removably inserted into the pin holes and the pin hole portions.

2. The mounting table structure of claim 1, wherein the engaging pins are made of a heat-resistant and corrosion-resistant material.

3. The mounting table structure of claim 2, wherein a seal structure having a labyrinth of prominences and depressions is provided in a joint region of the cover portion and the container body.

4. The mounting table structure of claim 1, wherein the heater is divided into a plurality of zones and is temperature-controllable on a zone-by-zone basis.

5. The mounting table structure of claim 4, wherein a plurality of temperature measuring elements is provided on a rear surface of the cover portion corresponding to the zones.

6. The mounting table structure of claim 5, wherein each of the temperature measuring elements has a measuring line extending into the supporting column.

7. The mounting table structure of claim 1, wherein the supporting column has a top end portion removably attached to a center region of a bottom surface of the mounting table by means of a bolt member.

8. The mounting table structure of claim 7, wherein the bolt member is made of a heat-resistant material.

9. The mounting table structure of claim 7, wherein a seal member is provided in a joint region of the top end portion of the supporting column and the bottom surface of the mounting table.

10. The mounting table structure of claim 1, wherein the heating plate includes a line sealing pipe for sealingly enclosing a power supply line through which an electric power is supplied to the heater, the line sealing pipe being made of a heat-resistant material, the line sealing pipe extending into the supporting column through the container body.

11. The mounting table structure of claim 1, wherein a conductive member extending in a planar direction is embedded in the cover portion and a conductive line is connected to the conductive member, the conductive line extending into the supporting column.

12. The mounting table structure of claim 1, wherein a conductive member extending in a planar direction is provided between the cover portion and the heating plate and a conductive line is connected to the conductive member, the conductive line extending into the supporting column.

13. The mounting table structure of claim 12, wherein the conductive member is bonded to a bottom surface of the cover portion.

14. The mounting table structure of claim 12, wherein the conductive member is bonded to a top surface of the heating plate.

15. The mounting table structure of claim 13, wherein a protective layer made of a heat-resistant insulating material is provided on a surface of the conductive member to cover the entire surface.

16. The mounting table structure of claim 14, wherein a protective layer made of a heat-resistant insulating material is provided on a surface of the conductive member to cover the entire surface.

17. The mounting table structure of claim 1, wherein the mounting table further includes a conductive member provided on a top surface of the cover portion and extending in a planar direction; a protective layer provided to cover an entire surface of the conductive member, the protective layer being made of a heat-resistant insulating material; and a conductive line connected to the conductive member.

18. The mounting table structure of claim 17, wherein the protective layer is formed by coating the heat-resistant insulating material.

19. The mounting table structure of claim 17, wherein the protective layer is formed by bonding a sheet made of a heat-resistant insulating material with an adhesive agent.

20. The mounting table structure of claim 1, wherein the heat-resistant material, and the heat-resistant and corrosion-resistant material are composed of an insulating material.

21. The mounting table structure of claim 20, wherein the insulating material is made of a ceramic material selected from the group consisting of quartz glass, AlN, $Al_2O_3$ and $Si_3N_4$.

22. The mounting table structure of claim 1, wherein a gas inlet opening is formed in a flange provided on a bottom portion of the supporting column, and an inert gas supply system is connected to the gas inlet opening, and
   wherein an inert gas supplied from the inert gas supply system is introduced into the supporting column and the container and leaked out little by little through a gap provided in a joint region of the supporting column and the mounting table and a gap provided in a joint region of the container body and the cover portion.

23. A heat treatment apparatus comprising:
   a vacuum-evacuatable processing chamber;
   a mounting table structure arranged within the processing chamber; and
   a gas supply unit for supplying a specified processing gas into the processing chamber, wherein the mounting table structure includes: a mounting table, arranged within the processing chamber, for mounting a target object to perform a specified heat treatment thereon; and a hollow supporting column for supporting the mounting table, the supporting column being standing on a bottom portion of the processing chamber, wherein the mounting table includes: a heating plate including a heat-resistant material and a heater as an electric heat source embedded in the heat-resistant material; and a heating plate accommodating container made of a heat-resistant and corrosion-resistant material, the container including a container body with an opening for removably receiving the heating plate and a cover portion detachably attached to the opening of the container body, wherein the cover portion has a sidewall extending downwardly, so that the cover portion covers the container body such that the sidewall of the cover portion is overlapped with a sidewall of the container body, and wherein pin holes are formed at the sidewall of the cover portion and pin hole portions communicating with the pin holes are formed at the sidewall of the container body, and engaging pins are removably inserted into the pin holes and the pin hole portions.

24. The heat treatment apparatus of claim 23, wherein the mounting table further includes a conductive member provided on a top surface of the cover portion and extending in a planar direction; a protective layer provided to cover an entire surface of the conductive member, the protective layer being made of a heat-resistant insulating material; and a conductive line connected to the conductive member.

* * * * *